United States Patent [19]

Tarng et al.

[11] Patent Number: 5,188,499
[45] Date of Patent: Feb. 23, 1993

[54] METHOD AND APPARATUS FOR VARYING WAFER SPACING

[75] Inventors: Jawhorng Tarng, Garland; John I. Lau, Dallas, both of Tex.

[73] Assignee: Mactronix, Dallas, Tex.

[21] Appl. No.: 627,327

[22] Filed: Dec. 14, 1990

[51] Int. Cl.⁵ ............................................. B65G 65/00
[52] U.S. Cl. .................................. 414/404; 414/416; 414/417; 414/917; 414/680; 118/500
[58] Field of Search .............. 414/403, 404, 733, 734, 414/405, 416, 417, 917, 680, 222, 217, 331; 118/500

[56] References Cited

U.S. PATENT DOCUMENTS

| | | | |
|---|---|---|---|
| 4,215,967 | 8/1980 | McGill et al. | 414/416 |
| 4,257,727 | 3/1981 | Peyton | 414/416 |
| 4,568,234 | 2/1986 | Lee et al. | 414/404 |
| 4,856,957 | 8/1989 | Lau et al. | 414/417 X |
| 4,938,655 | 7/1990 | Asano | 414/404 X |
| 4,987,407 | 1/1991 | Lee | 414/404 X |
| 5,007,788 | 4/1991 | Asano et al. | 414/404 X |

FOREIGN PATENT DOCUMENTS

| | | | |
|---|---|---|---|
| 236714 | 6/1986 | Fed. Rep. of Germany | 414/416 |
| 61074 | 5/1977 | Japan | 414/416 |

*Primary Examiner*—Frank E. Werner
*Attorney, Agent, or Firm*—Ross, Howison, Clapp & Korn

[57] ABSTRACT

A wafer handling apparatus having a variable pitch includes a supporting surface (12) for holding a boat (14) in a predetermined location. An elevator mechanism (20) is operable to move upward through the boat to lift wafers (16) upward into intermediate restraining combs (24) and (26). Combs (22) are disposed on the elevator mechanism (20) for holding the wafers (16) on the edges thereof. The combs (22) can have the pitch thereof varied by the operation of a cylinder (56). The combs (22) have two rotating brackets (42) and (40) disposed on the sides thereof. The brackets (42) and (40) are pivoted on an elevator bracket (28) at points (44) and (46). When the lower bracket (40) is reciprocated upward by the cylinder (56) and the associated rod (54), the space between the combs (22) decreases.

4 Claims, 4 Drawing Sheets

METHOD AND APPARATUS FOR VARYING WAFER SPACING

TECHNICAL FIELD OF THE INVENTION

The present invention pertains in general to wafer handling apparatus and, more particularly, to a wafer handling apparatus that varies the spacing between the wafers.

CROSS REFERENCE RELATED APPLICATIONS

This application is related to U.S. Pat. No. 4,695,217, issued Sep. 22, 1987 and U.S. Pat. No. 4,856,957, issued Aug. 15, 1989.

BACKGROUND OF THE INVENTION

Wafer handling apparatus are generally utilized to transfer wafers from one transporting vehicle to another. These transporting vehicles are normally referred to as "boats". Each of these boats, when loaded, provides a predetermined spacing for the wafers. The wafers are typically transferred from the moving boat to a quartz boat, the quartz boat utilized to hold the wafers for processing. When moving wafers from one location to another, it is only necessary to retain the wafers in such as manner that they do not touch each other so as not to scratch or in any way damage the surface of the wafers. The wafer handling apparatus is operable to transfer the wafers from the moving boat to the quartz boat for processing thereof and back to the moving boat after processing.

During processing, it is sometime desirable to vary the wafer spacing to allow for a more even processing over the surface of the wafer. However, it is still desirable to minimize the distance between the wafers to allow the maximum number of wafers to be placed into the processing environment. With present systems, predetermined wafer spacings are provided and the only way to increase this wafer spacing is to incrementally increase the spacing, i.e., spaced every retaining slot, every other retaining slot, every third retaining slot, etc. There is no provision at present to accommodate spacing distances that are fractions of the spacing in the boat that holds the wafers, which spacing is conventional.

SUMMARY OF THE INVENTION

The present invention disclosed and claimed herein comprises a method and apparatus for varying the wafer spacing between a plurality of wafers when the wafers are transferred between two transport mechanisms each operable to hold the wafers at a different wafer spacing. A first wafer transport mechanism is provided for holding a plurality of wafers in a substantially parallel relationship and at a first wafer spacing. A second wafer transport mechanism is provided for holding the wafers in a substantially parallel relationship and at a second wafer spacing. The first and second wafer spacings differ. The wafers are removed from the first wafer transport mechanism at the first wafer spacing and then transferred to the second wafer transport mechanism. Between transfer, the spacing of all the wafers removed from the first wafer transport mechanism are varied by urging the removed wafers from the first wafer spacing to the second wafer spacing.

In another aspect of the present invention, the second wafer transport mechanism includes a plurality of individual wafer retaining elements that are each operable to hold one of the plurality of wafers. A guide is provided for restraining movement of the individual retaining elements to a path substantially perpendicular to the surface of the wafers. Reciprocal movement of the retaining elements is limited to first and second limits, the first limit corresponding to the first wafer spacing and the second limit corresponding to the second wafer spacing. The wafer spacing is varied by first placing the removed wafers onto the retaining elements at the first position and then urging the retaining elements in the second wafer transfer mechanism to the second limit.

In yet another aspect of the present invention, a support surface is provided for holding the first and second wafer transport mechanisms. An intermediate transport mechanism is operable to be disposed beneath the support surface rise upward through the first wafer transport mechanism to remove the wafers therein at the first wafer spacing. The wafers are disposed in an intermediate retaining mechanism at the first wafer spacing and then the intermediate transport mechanism pulled down through the support surface. The second wafer transport mechanism is then disposed on the support surface and the intermediate transport mechanism is urged upward to the intermediate restraining mechanism to remove the wafers therefrom at the first wafer spacing. The wafer spacing is then changed in the intermediate transport mechanism from the first wafer spacing to the second wafer spacing and then the wafers lowered into the second transport mechanism at the second wafer spacing.

In yet a further aspect of the present invention, the intermediate transport mechanism has a plurality of individual combs disposed therein. Each of the combs is operable to hold one of the wafers n a substantially parallel position relative to the other combs and directed toward a common reference line when the combs are in a first position at the first wafer spacing. Each of the combs has a fixed point defined thereon. When the wafer spacing is varied from the first wafer spacing to the second wafer spacing, the combs are rotated upward about a common pivot point, the pivot point disposed to one end of the combs. During rotation, the combs are disposed in a parallel relationship such that they are maintained substantially perpendicular to the common reference line.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
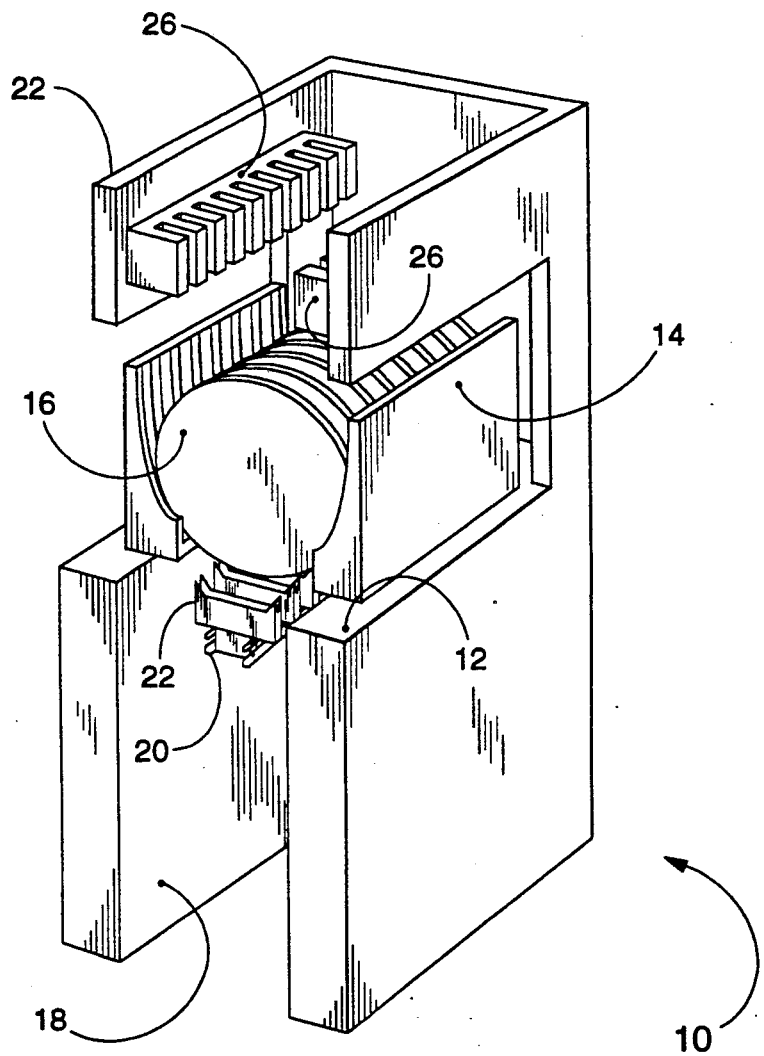
FIG. 1 illustrates a perspective view of the wafer handling apparatus showing the boat with wafers in place.

Referring now to FIG. 1, there is illustrated a perspective view of a wafer handling apparatus of the present invention. Numerous mechanical components, etc. are common between the wafer handling apparatus illustrated in FIG. 1 and the wafer handling apparatus described and disclosed in U.S. Pat. No. 4,856,957, issued Aug. 15, 1989 to John J. Lau and U.S. Pat. No. 4,695,216 issued Sep. 22, 1987 to John J. Lau et al., both patents incorporated herein by reference. The wafer handling apparatus is generally referred to by the reference numeral 10. Wafer handling apparatus 10 has a supporting surface 12 upon which a wafer handling boat 14 may be disposed. The supporting surface 12 is generally indexed for location such that when boat 14 is placed thereon, wafers 16 that are disposed in the boat 14 are correctly aligned.

Beneath the supporting surface 12, an elevator housing 18 is provided with an elevator 20 disposed for reciprocal operation therein. The elevator 20 has a plurality of combs 22 disposed thereon, each comb operable to interact with and support one of the wafers 16. Wafers 16 are normally disposed in a substantially vertical and upright position such that the surfaces therefore are parallel to each other and disposed a predetermined distance apart. The elevator 20 is operable to reciprocate upwards such that the upper surfaces of the combs 22 contact the lower peripheral edges of each of the individual wafers 16, thus raising them upward and away from the boat 14 at the same wafer spacing as that of the boat 14.

Above the platform 12 is a wafer retaining housing 22. The wafer retaining housing 22 has a plurality of combs 24 and 26, disposed on either side of the housing 22, respectively. The wafers 16, when reciprocated upward, are retained by the combs 24 and 26, which reciprocate inward to contact the peripheral edges of the wafer 16. As will be described hereinbelow, the wafer spacing is varied prior to being retained in the combs 24 and 26. The wafers are held in the combs 24 and 26 at a reduced wafer spacing compared to that of the boat 14, the boat 14 typically comprising a plastic boat as opposed to a quartz boat that is typically utilized for processing.

After retention by the combs 24 and 26, the elevator 20 is reciprocated downward and a new boat disposed on the supporting surface 12. The elevator 20 is then reciprocated upward to contact the lower edges of the wafers 16 that are retained by the combs 24 and 26 and then the combs 24 and 26 are reciprocated outward to release the wafers 16 to allow the elevator mechanism 20 to reciprocate downward and dispose the wafers 16 in the new boat. In this manner, wafer handling apparatus 10 is operable to transfer wafers 16 from one boat to the next.

In accordance with one aspect of the present invention, the wafer handling apparatus is operable to remove wafers from one boat, with a first spacing, and then dispose the wafers in a second boat with a second wafer spacing. As will be described hereinbelow, this is achieved in one of two ways. First, the spacing is varied with the elevator mechanism prior to placing the wafers 16 in the second or processing boat. Secondly, the processing boat itself is utilized to vary the spacing after the wafers are disposed therein.

In the first embodiment, illustrated in FIG. 1, the elevator mechanism 20 has a variable pitch. The first pitch matches that of the moving boat such that when the elevator mechanism 20 is reciprocated upward and contacts the lower peripheral edges of the wafers 16, the pitch is matched. Typically this is the larger pitch. The elevator mechanism is then operated to alter the pitch of the wafers 16 to the second pitch as the wafers 16 are raised upward through the center of the boat. The wafers 16 are then disposed in the combs 24 and 26 with the altered pitch. The elevator mechanism 20 is then lowered back into the housing 18 and a new boat placed on supporting surface 12. When the elevator mechanism 20 is next raised, the pitch remains the same to match that of the pitch of the wafers 16 retained in the combs 24 and 26. After the wafers 16 are removed from the combs 24 and 26 at this second pitch, the elevator mechanism 20 is then operated to lower the wafers 16 into the second boat.

Figure 2:
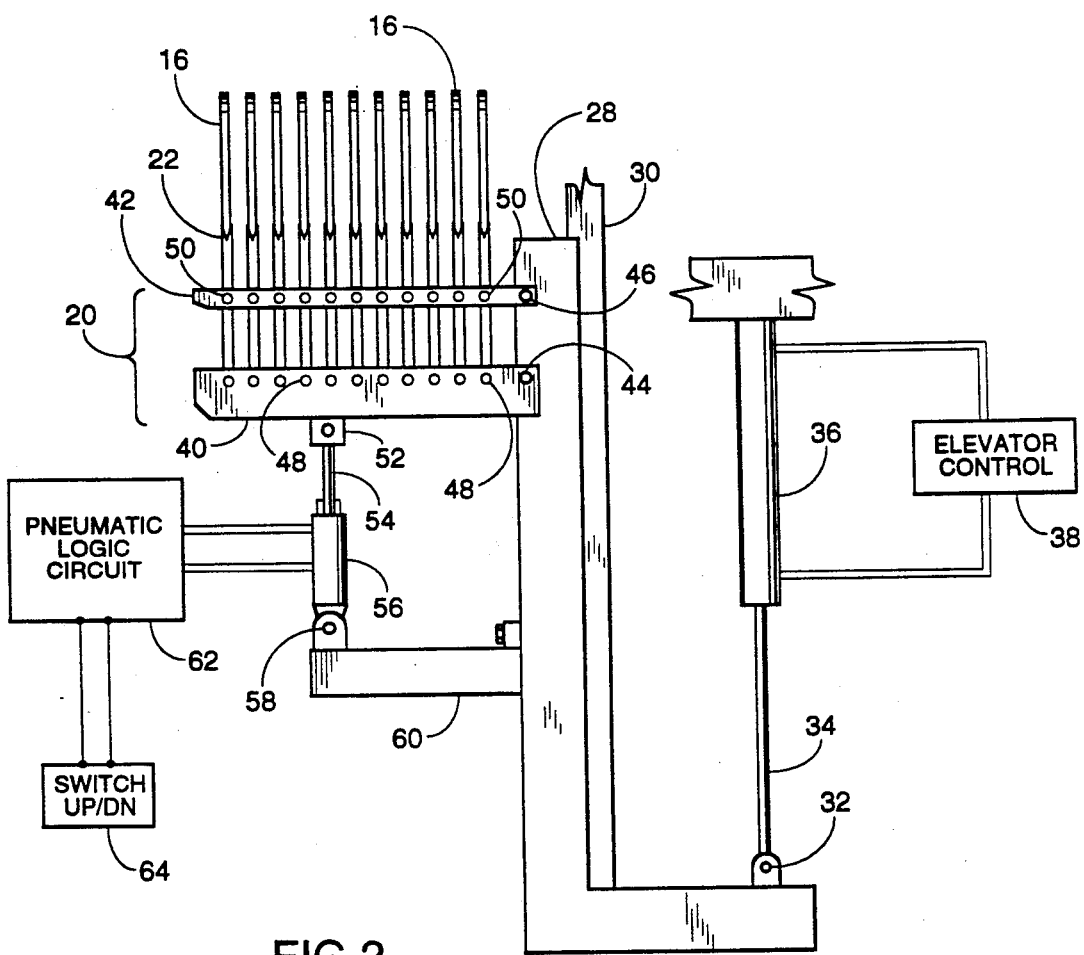
FIG. 2 illustrates a cross-sectional detail of the elevator apparatus for raising and lowering the wafers.

Referring now to FIG. 2, there is illustrated a detail of the elevator mechanism 20, and the method by which the pitch of the combs 22 is varied. The elevator mechanism 20 that holds the combs 22 is attached to a reciprocating plate 28 which is operable to reciprocate in a vertical direction on a track 30. The reciprocating plate 28 has a lower bracket 32 which is attached to one end of a rod 34, the other end of which reciprocates on a piston in a pneumatic cylinder 36. The opposite end of the cylinder 36 is anchored. The cylinder 36 is controlled by an elevator control device 38, which is a conventional pneumatic logic circuit that is operable to reciprocate the rod 34 upward or downward at an even and controlled rate.

The elevator mechanism 20 is comprised of a lower pivoting bracket 40 disposed on either side of the combs 22 and an upper pivoting bracket 42 disposed on either side of the combs 22. The lower pivoting bracket 40 is pivoted at a pivot point 44 on the reciprocating plate 28 and the upper pivoting bracket 42 is pivoted on one end at a pivot point 46 on the reciprocating plate 28. There are two lower pivoting brackets 40 and two upper pivoting brackets 42, one on either side of the combs 22.

All of the combs 22 are disposed in a parallel relationship and pivot on the lower end at pivot points 48 and along a common line in the lower pivoting bracket 40. The upper pivoting bracket 42 is disposed along the side of each of the combs 22 at a point approximately midway between the upper end of the combs 22 and the lower end thereof. Each of the combs 22 is pivotally attached at pivot points 50 in the upper pivoting bracket 42.

The lower side of the lower pivoting bracket 40 is pivotally attached at a pivot point 52 to one end of a reciprocating rod 54. The pivot point 52 is disposed outward a predetermined distance from the pivot point 40 on the reciprocating plate 28. The rod 54 is reciprocated within a pneumatic cylinder 56 on a piston (not shown), which is pivotally attached at the lower end thereof to a pivot point 58 on a mounting bracket 60. However, it should be understood that the pneumatic cylinder 56 could be replaced with an electro-mechanical device. The mounting bracket 60 is mounted on the reciprocating plate 28 and extends outward substantially perpendicular thereto.

The rod 54, when reciprocated upward, causes the lower reciprocating bracket 40 to rotate upward about pivot point 44. Since the combs 22 are pivotally attached thereto, the pivot points 48 are rotated upward about pivot point 44. However, the combs 22 also are pivotally connected to the upper pivoting bracket 42 such that the combs 22 translate the upward rotational motion of the lower pivoting bracket 40 to the upper pivoting bracket 42. The upper pivoting bracket 42 therefore pivots about the pivoting point 46. In this manner, the combs 22 are maintained in a substantially vertical and parallel relationship.

The pneumatic cylinder 56 is controlled by a pneumatic logic circuit 62 which is operable to force compressed air at a predetermined pressure into either the upper end of the cylinder 56 or into the lower end thereof. In this manner, the rod 54 can be reciprocated upward or downward in a smooth and even movement. The logic circuit 62 is controlled by an up/down switch 64 and also can be controlled automatically to perform the function of varying the pitch. When reciprocated upward, it can be seen that the distance between the wafers 16 will decrease. The position illustrated in FIG. 2 illustrates the maximum spacing between the wafers 16. The pitch changing operation will be described in more detail hereinbelow.

Figure 3:
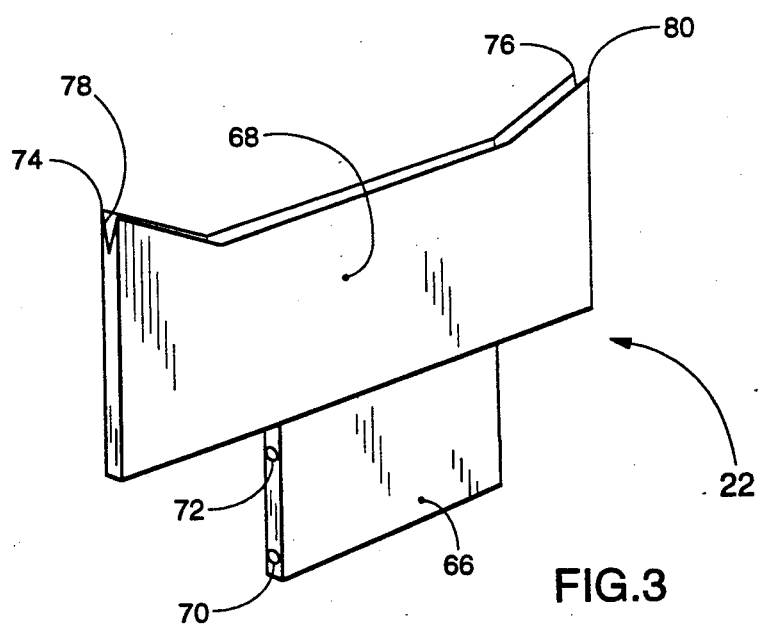
FIG. 3 illustrates a detail of one of the combs for holding a single wafer.

Referring now to FIG. 3, there is illustrated a detail of one of the combs 22. Each of the combs 22 is comprised of a lower portion 66 and an upper portion 68. The lower portion 66 is substantially rectangular in shape and has a longitudinal bore 70 disposed on the lower end thereof and extending from one side to the other, and a longitudinal bore 72 disposed in the upper end thereof and extending from side to the other. The bore 70 coordinates with the pivot points 48 in the lower pivoting bracket 40 and the bore 72 coordinates with the pivot points 50 in the upper pivoting bracket 42. Pins (not shown) are disposed through the bores 70 and 72 to allow rotational movement thereabout.

The upper portion 68 has an upward extending portion 74 on one side thereof and an upper extending portion 76 on the other side thereof. The upper extending portion 74 has a groove 78 disposed therein and, in a similar manner, the upward extending portion 76 has a groove 80 disposed therein. The grooves 78 and 80 are operable to interface with the peripheral edges of one of the wafers 16 such that the wafers 16 are disposed in a substantially upright and perpendicular orientation.

Figure 4:
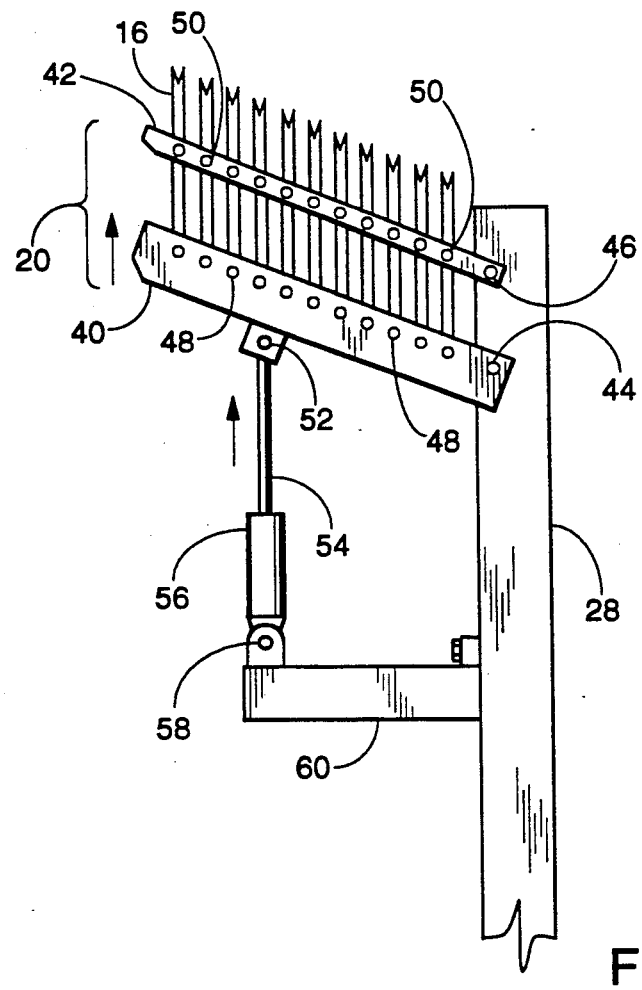
FIG. 4 illustrates a detail of the pitch varying mechanism.

Referring now to FIG. 4, there is illustrated a detail of the operation of the elevator mechanism 20 of FIG. 2. The detail of FIG. 4 illustrates the elevator mechanism 20 when the rod 54 is reciprocated by the cylinder 56 into an extended position. In this position, it can be seen that both the lower pivoting bracket 40 and the upper pivoting bracket 42 pivot but are maintained substantially parallel, since the pivoting points 44 and 46 are maintained along a perpendicular line. As such, each of the combs 16 will be maintained substantially parallel to the perpendicular lines of the pivot points 44 and 46. This, of course, is due to the fact that the pivot points 48 on the lower pivoting bracket 40 and the pivot points 50 on the upper pivoting bracket 42 are substantially equally spaced.

Figure 5:
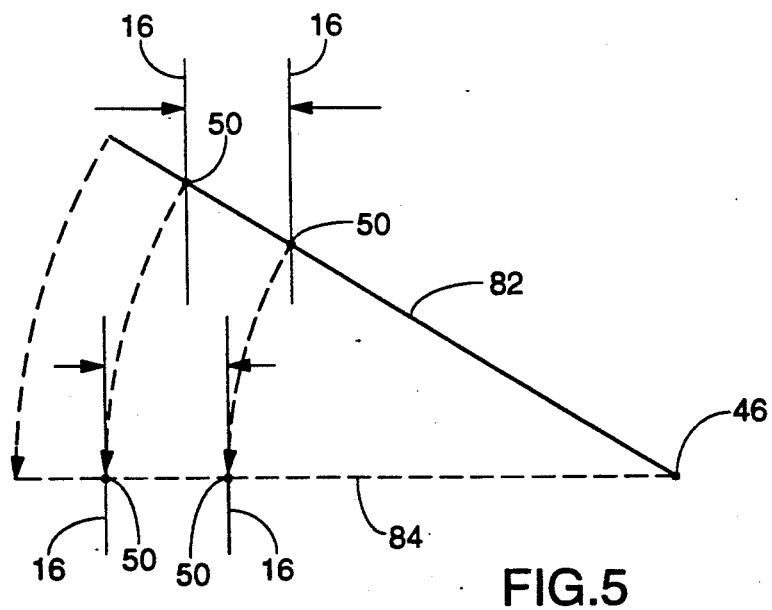
FIG. 5 illustrates a diagrammatic view of the wafer spacing operation of the pitch varying mechanism.

Referring now to FIG. 5, there is illustrated a diagrammatic view of the pivoting operation illustrating the varying pitch. The diagrammatic view is with respect to the pivot points 50 on the upper pivoting bracket 42. However, they can apply equally as well to the pivot points 48 on the lower pivoting bracket 40. Since the pivoting points 50 are arranged in a line and equally spaced, they will pivot about the pivot point 46 from a line 82 extending outward from the pivot point 46 to a dashed line 84 on a horizontal plane. Two positions, are represented, the line 82 representing the upward rotated position and the line 84 representing the stationary or horizontal position. In the rotated upward position, the distance between the two pivot points 50 that are illustrated provides a minimum distance between the two associated combs 22. When the upper pivoting bracket 42 is rotated downward to the horizontal position, represented by the dashed line 84, the distance between the two combs 22 extends to a maximum. In this manner, a varying pitch has been provided. It should be understood that, although only two positions are described, the cylinder 56 could be activated to any rotational position to provide any pitch between the maximum at the horizontal to a substantially zero pitch.

Figure 6A:
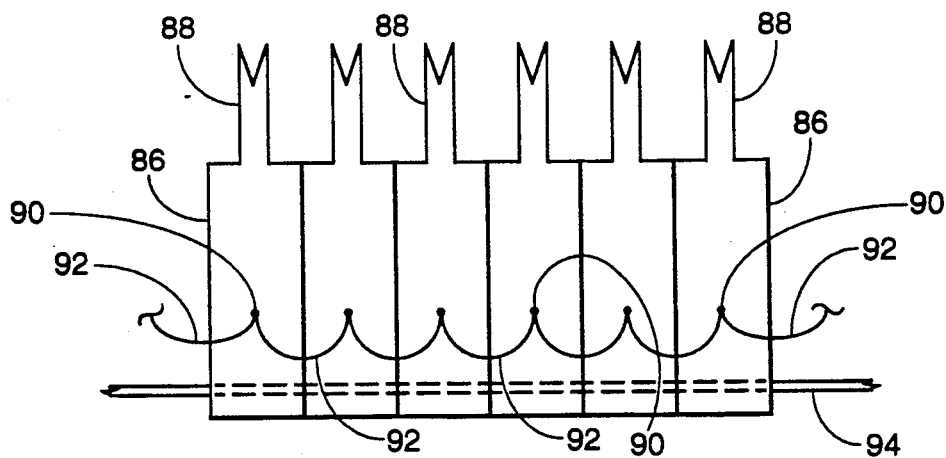
FIGS. 6a–6c illustrate an alternate embodiment of the pitch varying mechanism.
Figure 6B:
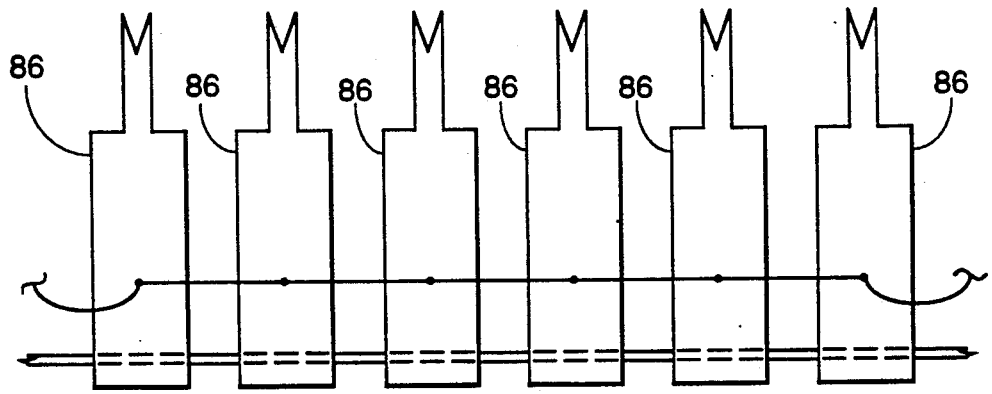
Figure 6C:
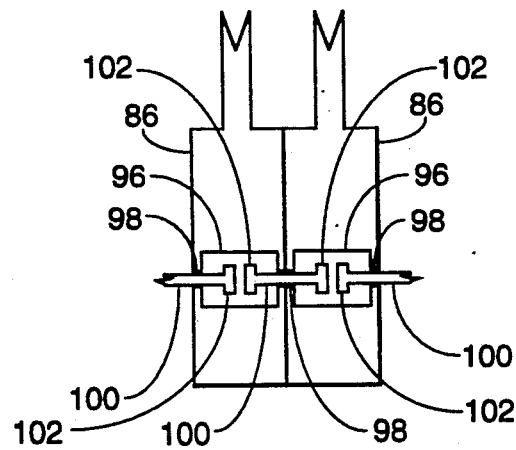

Referring now to FIGS. 6a–6c, there is illustrated an alternate method and apparatus for varying the pitch. In the embodiment of FIGS. 6a–6c, the boat itself has the spacing thereof varied after the wafers are transferred thereto. The boat is comprised of a plurality of segments 86. Each of the segments 86 has a lower portion and an upper portion, with the lower portion having a predetermined width and the upper portion having a groove 88 in the top thereof for holding the wafers. The groove at the upper end of the portions 86 can, for example, resemble the upper portion 68 of the combs 16.

Each of the sections 86 has an attachment point disposed substantially in the center thereof and on the sides. Although only one side of the segments 86 is illustrated, it should be understood that the attachment points 90 are disposed on both sides. In the embodiment illustrated in FIGS. 6a and 6b, a flexible restraining member 92 is provided having a predetermined length, each of the restraining members 92 having an equal length. When the sections 86 abut each other, the restraining members 92 are in a relaxed configuration. The sections 86 are operable to move along a guide 94 such that they can be placed in an abutting relationship and also in a non-abutting relationship by being separated outward along the guide 94. Typically, two guides 94 will be provided to prevent rotation of the sections 86 about the guide 94.

In FIG. 6b, the sections 86 are placed in a non-abutting relationship by pulling them away from each other. To accomplish this, it is only necessary to anchor one of the sections 86 at one end of the boat and then move the most distal section 86 in the opposite direction. This will result in each of the restraining members 92 being tightened to pull on the attachment points 90, thus pulling each of the sections 86 outward and spacing them by a dimension equal to the length of the restraining member 92. In this manner, two pitches can be defined. The first pitch is defined by the thickness of the sections 86 and the second pitch is defined by the length of the restraining member 92.

FIG. 6c illustrates an alternate embodiment of the restraining member. In FIG. 6c, a cavity 96 is formed in each of sections 86 on the outermost sides thereof, only one side illustrated. Each of the cavities 96 has an orifice 98 disposed between the cavity in each of the abutting surfaces. A rod 100 is disposed through the orifice, the rod 100 having an expanded portion 102 disposed on either end thereof. The rod 100 has a diameter slightly less than the orifice 98 such that it reciprocates therethrough. The expanded portion 102 acts as a stop such that it can only reciprocate outward in the cavity until the expanded portion 102 abuts the outer surface of the cavity 96.

When the sections 86 are in an abutting relationship, the expanded portions 102 will be disposed away from the outer surfaces of the cavity 96. When the sections 86 are moved away from each other, the expanded portions 102 move outward toward the orifice 98 within the respective cavity 96. However, when the expanded portions 102 contact the outer surface of the cavity 96, the sections 86 are restrained from moving further apart. This defines the maximum distance that they can be separated by.

In summary, there has been provided a method for varying the pitch of wafers between a first boat and a second boat. The method includes the step of removing the wafers from a first boat with a first pitch and then holding them in an intermediate restraining position. A new boat is then substituted and then the wafers moved from the intermediate restraining position to the second boat with the wafer spacing in the second boat being different as compared to that of the first boat. In one embodiment, the method utilizes an elevator mechanism that can vary the pitch of the wafers between the first boat and the intermediate restraining position. Therefore, this allows a boat with a different spacing to be utilized, with the elevator mechanism providing the pitch variation. In another embodiment, the boat itself has the spacing varied after disposal of the wafers therein.

Although the preferred embodiment has been described in detail, it should be understood that various changes, substitutions and alterations can be made therein without departing from the spirit and scope of the invention as defined by the appended claims.

What is claimed is:

1. An apparatus for transporting wafers and varying the spacing therebetween, comprising:
    a platform;
    a first wafer carrier having a plurality of first wafer holders, each of said first wafer holders for holding one of a plurality of wafers in a substantially parallel relationship and at a first wafer spacing, each of said first wafer holders having at least two edge support members for supporting an associated wafer on an edge thereof in an upright configuration, such that a portion on a lower edge of the wafer is exposed to the platform through a bottom of said first wafer carrier;
    an intermediate transport mechanism having a plurality of intermediate wafer holders, each of said intermediate wafer holders disposed beneath said platform and operable to move upward through the bottom of said first wafer carrier to contact and secure the lower exposed edge of the associated wafer to remove the wafers disposed therein at the first wafer spacing;
    an intermediate retaining mechanism having a plurality of retaining wafer holders, each of said retaining wafer holders disposed above said platform and operable to receive from said intermediate transport mechanism to associated wafers at a second wafer spacing for retention thereof, said second wafer spacing different from said first wafer spacing;
    a wafer spacing mechanism for urging each of the wafers and associated intermediate wafer holders from said first wafer spacing to said second wafer spacing while the wafers are disposed in said intermediate transport mechanism prior to transfer to said intermediate retaining mechanism from said intermediate transport mechanism;
    a second wafer carrier having a plurality of second wafer holders, each of said second wafer holders for holding one of the plurality of wafers in a substantially parallel relationship and at said second wafer spacing, said second wafer carrier operable to be disposed on said platform, each of said second wafer holders having at least two edge support members for supporting the associated wafer on the edge thereof in an upright configuration, such that a portion on the lower edge of the wafer is exposed to the platform through the bottom of said second wafer carrier;
    said intermediate transport mechanism operable to be urged upward through the bottom of said second wafer carrier when disposed on said platform and toward said intermediate retaining mechanism to remove the wafers therefrom; and
    said intermediate transport mechanism operable to be moved downward with the wafers removed form said intermediate retaining mechanism such that the wafers at said second wafer spacing are disposed in said second wafer carrier, said intermediate transport mechanism moved downward through the bottom of said second wafer carrier to dispose the wafers therein at the second wafer spacing.

2. The apparatus of claim 1 wherein the wafers are held in said first and second wafer carriers in a substantially upright and perpendicular orientation.

3. The apparatus of claim 1 wherein said wafer varying mechanism comprises:
    a plurality of wafer combs, each of said wafer combs operable to retain the associated one of the plurality of wafers such that the faces of adjacent wafers are substantially parallel and directed perpendicular to a common reference line when said wafer combs are in a first position;
    each of said wafer combs having associated therewith a specific point defined in a plane thereof and all of said specific points in a substantially common line;
    mean for rotating said wafer combs about a pivot point along said common line, said means for rotating operable to rotate said wafer combs from said first position to a second position and, during rotation, said means for rotating maintaining said wafer combs in a substantially parallel relationship to each other and varying an angle thereof relative to said common reference line; and
    wherein said wafer combs have a different wafer spacing at said second position than the spacing at said first position.

4. The apparatus of claim 1 wherein said wafer spacing mechanism comprises:
    a plurality of individual combs having a lower portion and an upper portion, said upper portion for retaining an associated one of the plurality of wafers on lower peripheral edges thereof in a substantially upright position such that the associated one of the plurality of wafer sis held thereon by gravity;
    first and second pivot points disposed on said intermediate transport mechanism such that said first pivot point is disposed above said second pivot point along a common perpendicular;
    a first longitudinal arm pivoted at one end thereof at said first pivot point;

a second longitudinal arm pivoted at said second pivot point on one end thereof;

each of said combs having a first pivot point at an upper end of said lower portion and a second pivot point at a lower end of said lower portion;

said first longitudinal arm pivotally interfaced with each of said first pivot points on said lower portion of said combs;

said second longitudinal arm pivotally connected to said second pivot points on said lower portion of said combs such that said combs are maintained in a parallel relationship at said first wafer spacing when said first and second longitudinal arms are parallel and perpendicular to said intermediate transport mechanism;

a rotating mechanism for rotating said second longitudinal arm upward about said second pivot point; and wherein said first and second longitudinal arms are maintained in a parallel relationship during rotation of said second longitudinal arm and said combs are also maintained in a parallel relationship such that they rotate upward about said first and second pivot points on said lower portions to reduce the spacing therebetween to said second wafer spacing.

* * * * *